(12) United States Patent
Kim

(10) Patent No.: US 6,704,225 B2
(45) Date of Patent: Mar. 9, 2004

(54) SENSING CIRCUIT FOR NONVOLATILE MEMORY DEVICE

(75) Inventor: Dae-Han Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 205 days.

(21) Appl. No.: 10/028,694

(22) Filed: Dec. 28, 2001

(65) Prior Publication Data

US 2002/0122332 A1 Sep. 5, 2002

(30) Foreign Application Priority Data

Dec. 29, 2000 (KR) ........................................ 2000-85149

(51) Int. Cl.[7] .............................................. G11C 16/06
(52) U.S. Cl. .............................. 365/185.21; 365/185.2; 365/205; 365/207; 365/208

(58) Field of Search ........................ 365/185.21, 185.2, 365/205, 207, 208

(56) References Cited

U.S. PATENT DOCUMENTS 4,910,711 A * 3/1990 Guo .................... 365/189.065
6,535,429 B2 * 3/2003 Conte et al. ........... 365/185.21

* cited by examiner

*Primary Examiner*—Connie C. Yoha
(74) *Attorney, Agent, or Firm*—Jacobson Holman PLLC

(57) ABSTRACT

A sensing circuit of a non-volatile memory device comprises a regulation unit, a DTMOS transistor, a first NMOS transistor, a second NMOS transistor and a sense amplifier. The sensing circuit of the present invention eliminates the threshold voltage on the high voltage transistor; therefore, the sensing circuit prevents gate oxide breakdown, makes it possible to drive the sensing circuit using a low voltage, and increases processing speed by improving transconductance.

4 Claims, 3 Drawing Sheets

SENSING CIRCUIT FOR NONVOLATILE MEMORY DEVICE

FIELD OF THE INVENTION

The present invention relates to a sensing circuit for a nonvolatile memory device for preventing gate oxide breakdown and for increasing the processing speed of a memory device.

DESCRIPTION OF THE PRIOR ARTS

FIG. 1 is a circuit diagram of a conventional sensing circuit of a flash memory device.

Referring to FIG. 1, a first PMOS transistor P11 and a second PMOS transistor P12 are provided between a power source and node Q11 and they are connected to each other in series. The first PMOS transistor P11 is driven by a sensing amplifier enable bar signal SAENb and the second PMOS transistor P12 is driven by the electric potential at node Q13. A drain of a first NMOS transistor N11 is connected to node Q11 and its source is connected to ground $V_{SS}$. A drain of a second NMOS transistor N12 is connected to node Q11 and its source is connected to ground $V_{SS}$. The first and second NMOS transistors N11 and N12 are commonly connected at node Q11. The first NMOS transistor N11 is driven by the sensing amplifier enable bar signal SAENb and the second NMOS transistor N12 is driven by the electric potential at node Q13. A third PMOS transistor P13 is connected to a third NMOS transistor N13 in parallel and they are provided between a power source and node Q12. The third PMOS transistor P13 is turned on due to a ground voltage and the third NMOS transistor N13 is turned on due to a power voltage $V_{cc}$. A fourth NMOS transistor N14 is connected to node Q12 and to node Q13. The fourth NMOS transistor N14 is driven by the electric potential at node Q11. A fifth NMOS transistor N15 is connected to node Q13 and to a program enable signal PGMEN, driven by the program enable signal PGMEN. A sixth NMOS transistor N16 and a seventh NMOS transistor N17 are connected in series to each other between node Q13 and the ground $V_{SS}$. The sixth NMOS transistor N16 is driven by a first address signal ADDR1 and the seventh NMOS transistor N17 is driven by a second address signal ADDR2. A memory cell array M11 is connected to the seventh NMOS transistor and a sense amplifier 11 receives the electric potential at node Q12, compares it with a reference cell voltage Vref and outputs sensing signal SAOUT.

The method of driving the above-mentioned flash memory device is described below in detail with reference to FIG. 2.

At a first time period T1, a sensing amplifier enable bar signal SAENb is applied to the first PMOS transistor P11 and the first NMOS transistor N11 in a low state. Thus, the first PMOS transistor P11 is turned on and the first NMOS transistor N11 is turned off. The second PMOS transistor P12 is turned on by the turned on first PMOS transistor P11 or an electric potential at node Q13, which is maintained at an initial low state. The power voltage $V_{cc}$ is applied through the second PMOS transistor P12 to node Q11 and it is maintained at a high state. The fourth NMOS transistor N14 is turned on by an electric potential at node Q11, which is maintained at a high state. Node Q13 is in a high state due to the power voltage $V_{cc}$ applied from the third PMOS transistor P13, the third NMOS transistor N13, and the fourth NMOS transistor N14. However, since the first address signal and the second address signal stays in a low state, the sixth and seventh transistors N16 and N17 can not be turned on so a current path of a memory cell array M11 also can not be established. Therefore, node Q13 stays in a high state. In response to its potential, the second PMOS transistor P12 is turned off and the second NMOS transistor N12 is turned on. As the second NMOS transistor N12 is turned on, the potential at node Q11 becomes low. Therefore, as a result of the above-mentioned operations of the conventional sensing circuit, the conventional sensing circuit maintains a constant potential at node Q13 in spite of increasing the power voltage $V_{cc}$. Node Q11 also has a constant regulated potential.

At a second time period T2, high levels of the first and second address signals ADDR1 and ADDR2 are respectively applied to the sixth and seventh NMOS transistors N16 and N17. However, node Q13 is still maintained at a constant potential because a high enough wordline voltage WL is not applied for turning on the memory cell array M11.

At a third time period T3, a high voltage level on the wordline WL is applied to the memory cell array (nonvolatile transistor) M11, so that a current path is established in the memory cell array M11. In other words, in the case that the memory cell array M11 is programmed, the potential at node Q13 is maintained at a constant level because a current does not flow through the cell and the value of the potential at a sensing node Q12 is the difference between the power voltage $V_{cc}$ and a threshold voltage on the third PMOS transistor P13 or the third NMOS transistor N13. In the case that data in the memory cell array M11 is erased, the current flows through the cell, therefore, the voltage on node Q12 is lower than in the case that the memory cell array M11 is programmed. In other words, the conventional sense amplifier 11 determines a sensing result by comparing the voltage at node Q12 with a reference voltage Vref. The voltage at node Q12 is regulated according to whether the memory cell array M11 is programmed or erased.

There are several requirements for driving the conventional sensing circuit of the volatile memory device normally. First of all, the breakdown voltage has to be high since the oxide film has to be thin in order to drive the sensing circuit with a low voltage. Second, the transconductance has to be high for quickly pre-charging a high load voltage on a bit line. Finally, the threshold of the fourth NMOS transistor N14 has to be set up efficiently for controlling the potential at node Q12. The fourth NMOS transistor N14 is driven by a potential at node Q13 and a potential at node Q12 is controlled by driving the fourth NMOS transistor N14. These elements of the circuit are formed as a negative feedback loop. This is because the response time may be longer if the voltage swing of node Q11 is too great in the case that a depletion MOS transistor is used as the NMOS transistors in the circuit.

The conventional sensing circuit of the nonvolatile memory device uses the fourth NMOS transistor N14 as a voltage NMOS transistor for controlling the potential on node Q12. The low voltage of NMOS transistor is 0.55 V for the threshold voltage and 4 V for the breakdown voltage. However, the time for pre-charging a bit line, in this case, may be longer since the transconductance is small. Additionally, since the gate used for low voltage driving employs a thin oxide film of approximately 80 Å, the oxide film can be easily broken down while the circuit is being driven.

Meanwhile, a low voltage depletion NMOS transistor can be used for the fourth NMOS transistor N14. The low voltage depletion NMOS transistor has a threshold voltage of 0 V and a breakdown voltage of 4 V. In this case, the transconductance is high enough to result in a decrease in the length of an initial bit line pre-charge process. However, after the bit line pre-charge process is done, the fourth NMOS transistor N14 is turned off since the potential on node Q11 is higher than the potential at node Q13. The fourth NMOS transistor N14 is turned on when the potential at node Q13 is equal to or higher to the potential at node Q11. Therefore, additional time is required for the above-mentioned process and that is the reason why the processing time of a memory should be reduced.

The above-mentioned problem of using a low voltage NMOS transistor or depletion NMOS transistor in the conventional sensing circuit could be solved by installing an additional circuit; however, it reduces sensing time, reduces stability of a memory cell, and increase the size of the circuit.

SUMMARY OF THE INVENTION

It is, therefore, an object of the present invention to provide a sensing circuit of a nonvolatile memory device for preventing breaking down of the gate oxide, which prevents improvements in the sensing speed, and which increases the size of a circuit.

It is another object of the present invention to provide a low voltage controlled sensing circuit of a nonvolatile memory device by controlling a threshold voltage and preventing gate oxide breakdown.

It is still another object of the present invention to provide a sensing circuit of a nonvolatile memory device for increasing the operation speed by improving the characteristics of transconductance.

In accordance with an aspect of the present invention, there is provided a sensing circuit of a nonvolatile memory device comprising: a memory cell array; a regulation unit for regulating a power voltage to a certain level in response to a control signal; a first switching unit for setting up a current path from a power source to the memory cell array in response to an output signal of the regulation unit; a second switching unit for controlling the well potential on the first switching unit in response to the control signal; a third switching unit for controlling the well potential on the first switching unit in response to the regulation unit; and, a sense amplifier for sensing a condition of the memory cell array and determining an output signal by comparing the sensing result and a reference voltage.

The gate oxide breakdown problem can be solved by using a high voltage element such as a 175-thick oxide film. The threshold voltage can be controlled, except that a special element, such as a depletion transistor is used. The threshold voltage can be controlled in a range of 0.5 V to 0.8 V. The transconductance also can be controlled by dynamically controlling the threshold voltage.

Therefore, the present invention uses a Dynamic Threshold MOSFET (DTMOS) for accomplishing objects of the present invention. The DTMOS is produced by a conventional SOI process. The present invention uses a high triple voltage well NMOS transistor. In other words, by applying a positive voltage instead of applying a ground voltage Vss to a triple p-well, a threshold voltage is reduced for improving voltage usage versus driving power.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 3:
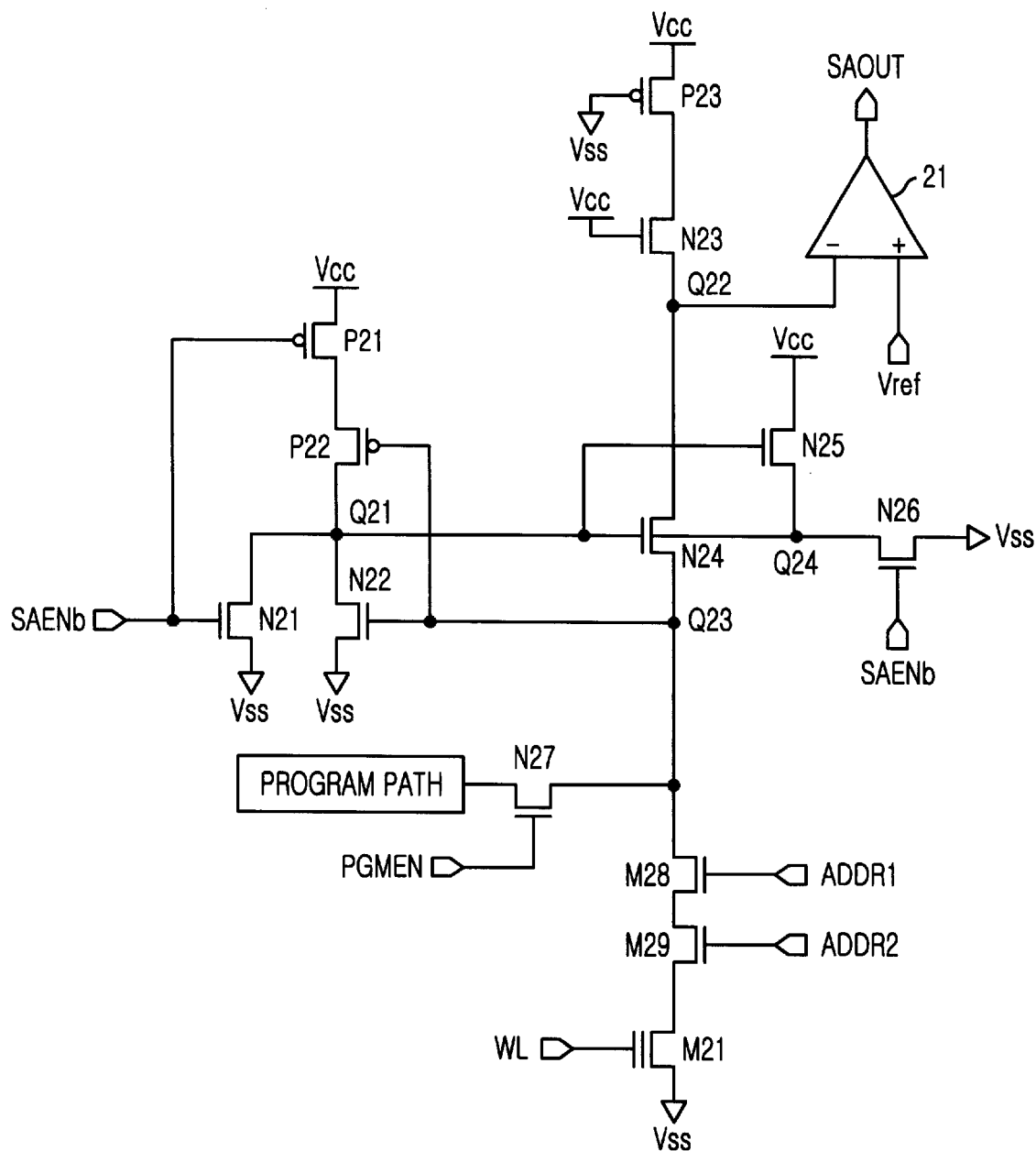
FIG. 3 is a schematic diagram of a conventional sensing circuit of a non-volatile memory device in accordance with the preferred embodiment of the present invention.

Referring to FIG. 3, a first PMOS transistor P21 is connected to a second PMOS transistor P22 in series between a power source and node Q21. The first PMOS transistor P21 is driven by a sensing amplifier enable bar signal SAENb and the second PMOS transistor P22 is driven by a potential at node Q23. A first NMOS transistor N21 is connected to a second NMOS transistor N22 in parallel between node Q21 and ground voltage $V_{SS}$. The first NMOS transistor N21 is driven by the sensing amplifier enable bar signal SAENb and the second NMOS transistor N22 is driven by the potential at node Q23. A third PMOS transistor P23 is connected to a third NMOS transistor N23 in series between a power source $V_{cc}$ and node Q22. The third PMOS transistor P23 is turned on due to a ground voltage $V_{SS}$ and the third NMOS transistor N23 is turned on due to a power voltage $V_{cc}$. The drain of a fourth NMOS transistor N24 is connected to node Q22 and the source of a fourth NMOS transistor N24 is connected to node Q23. The fourth NMOS transistor N24 is a DTMOS transistor and is driven by the potential at node Q21. A fifth NMOS transistor N25 is provided between a power source VCC and node Q24. The fifth NMOS transistor N25 is driven by the potential at node Q21. A sixth NMOS transistor N26 is provided between the fourth node Q24 and the ground voltage $V_{SS}$. The sixth NMOS transistor N26 is driven by the sensing enable bar signal SAENb. A seventh NMOS transistor N27 is provided between a program path and node Q23. The seventh NMOS transistor N27 is driven by a program enable signal PGMEN. An eighth NMOS transistor N28 is connected to a ninth NMOS transistor N29 in series. The eighth NMOS transistor N28 is driven by an address signal ADDR1 and the ninth NMOS transistor N29 is driven by an address signal ADDR2. A memory cell array (non-volatile transistor) M21 is connected to the ninth NMOS transistor N29. A sense amplifier 21 receives the potential at node Q22, compares it with a reference voltage Vref, and outputs a comparison result SAOUT.

Figure 4:
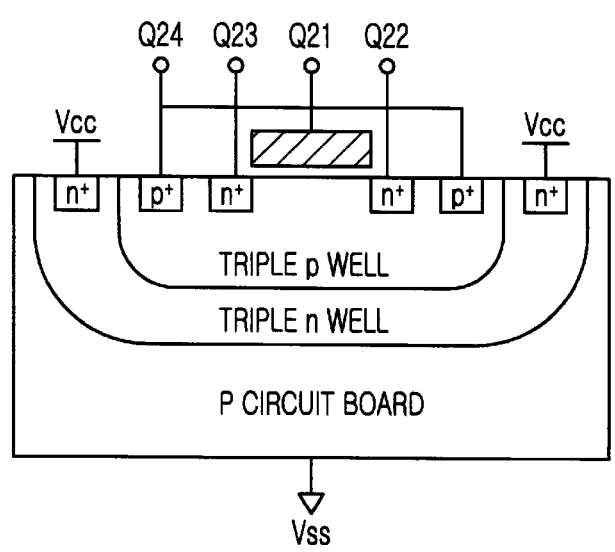
FIG. 4 is a diagram of a transistor with at least one isolated well applied to the preferred embodiment of the present invention.

Referring to FIG. 4, the potential at node Q21 is applied to the gate, the potential at node Q23 is applied to the source, and the potential at node Q22 is applied to the drain. The potential at a fourth node Q24 is applied to a triple p-well and a power voltage $V_{cc}$ is applied to a triple n-well.

The threshold voltages of a fourth NMOS transistor N24 in response to a potential on node Q24, which is applied to the triple p-well of the DTMOS transistor are described in Table 1.

TABLE 1

| Q24 ~ Q23 | Threshold voltage |
|---|---|
| −0.3 V | 0.57 V |
| 0.0 V | 0.47 V |
| 0.3 V | 0.37 V |

Figure 1:
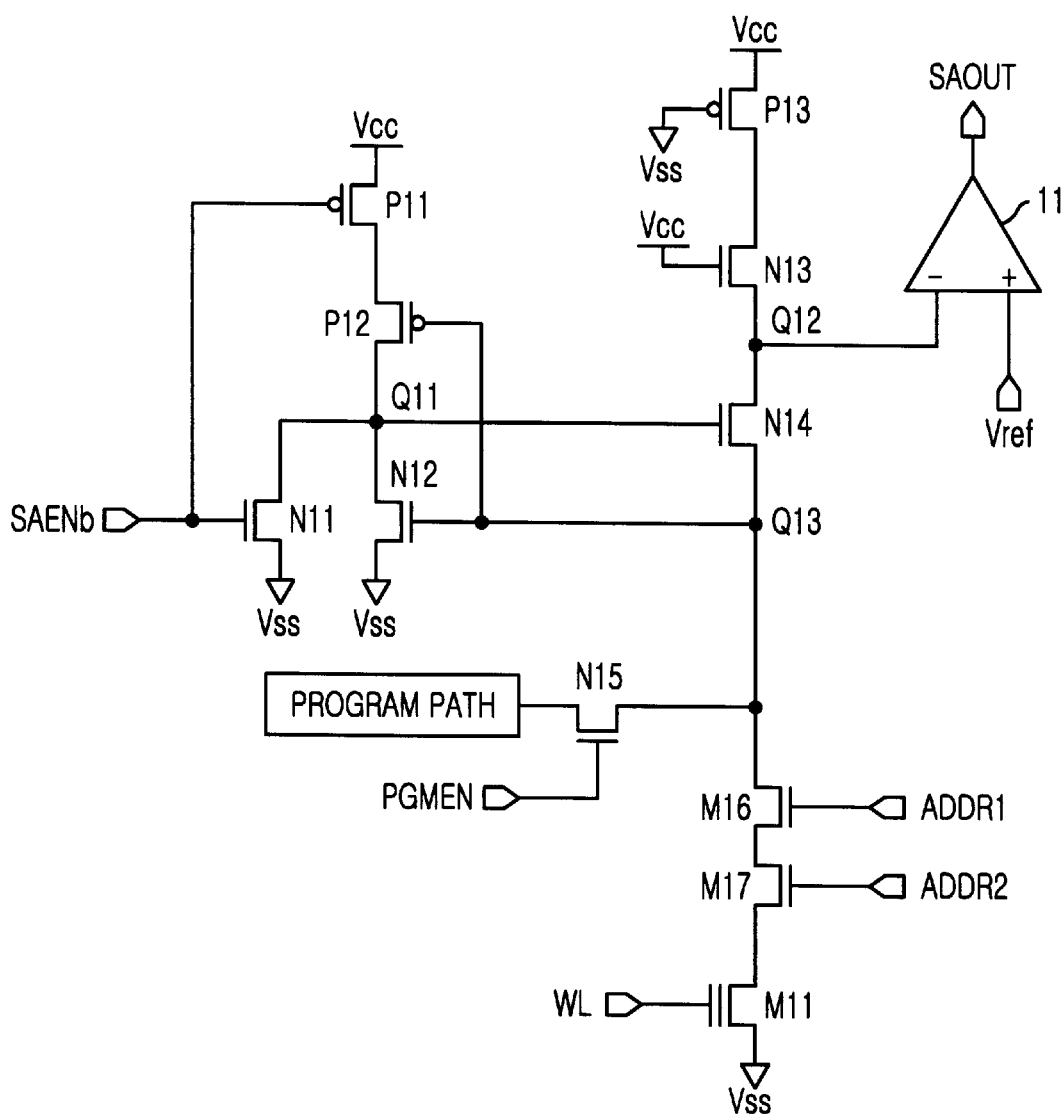
FIG. 1 is a schematic diagram of a conventional sensing circuit of a non-volatile memory device.
Figure 2:
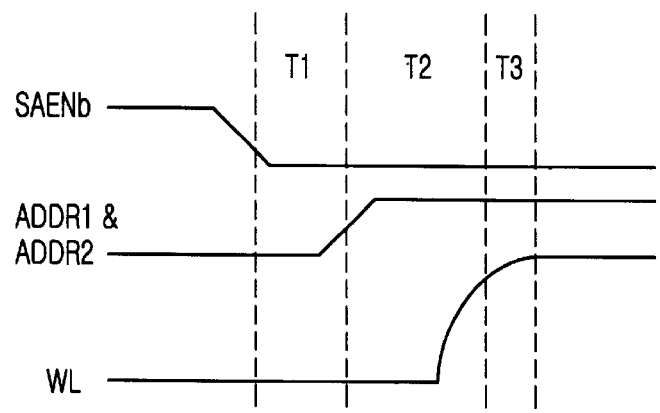
FIG. 2 a graph for showing a wave form of a signal applied to the conventional sensing circuit of FIG. 1.

The driving operation of the present invention in accordance with the above-mentioned structure is described in detail below with respect to FIG. 2.

Before a time T1, a sensing enable bar signal is applied as a high state and a first NMOS transistor N21 is turned on and a first PMOS transistor P21 is turned off, therefore, node Q21 maintains its potential in a low state. Fourth and fifth NMOS transistors N24 and N25 are turned off by a low level potential at node Q21. On the other hand, a sixth NMOS transistor N26 is turned off by the high level sensing amplifier enable bar signal SAENb so the potential at a fourth node Q24 stays in a low state. Therefore, a threshold voltage is maintained at 0.47 V by biasing the ground voltage to the triple p-well of the fourth NMOS transistor N24.

In a time T1, the sensing amplifier enable bar signal SAENb is applied as a low level signal so the first PMOS transistor P21 is turned on and a first NMOS transistor N21 and a sixth NMOS transistor N26 is turned off. A second PMOS transistor P22 is turned on by the potential at node Q23, which is maintained at an initial low state. Node Q21 is maintained at a high state due to a power voltage $V_{cc}$ applied from the first PMOS transistor P21 and the second PMOS transistor P22.

A fourth NMOS transistor N24 and a fifth NMOS transistor node Q21, which are maintained at a high state, turn on the fifth NMOS transistor N25. A power voltage $V_{cc}$ is applied to node Q23 and node Q24 through the fourth and fifth NMOS transistors N24 and N25. At the triple p-well of the fourth NMOS transistor N24, which is node Q24, a voltage as high as the difference between the power voltage $V_{cc}$ and a threshold voltage on the fifth NMOS transistor N25 is applied. The potential at node Q23 increases due to a power voltage $V_{cc}$ applied from the fourth NMOS transistor N24, however, it is lower than the voltage applied to the triple p-well of the fourth NMOS transistor N24. Therefore, a diode forward bias is formed between node Q23 and node Q24, which is the source of the fourth NMOS transistor N24. By forming the diode forwarding bias, a depletion area of the p-well in the source area of the fourth NMOS transistor N24 and the threshold voltage on the fourth NMOS transistor N24 are decreased. As shown in Table 1, the threshold voltage is decreased 0.1 V due to a 0.3 V diode forwarding biasing between the source and the p-well in the case of the DTMOS transistor. Since the threshold voltage can be controlled, low voltage driving is possible by using a low threshold voltage without producing low voltage elements. Here, the threshold voltage on the fourth NMOS transistor N24 is equal to or higher than the threshold voltage on the fifth NMOS transistor N25. If the threshold voltage on the fifth NMOS transistor N25 is higher than the threshold voltage on the fourth NMOS transistor, the sense amplifier will malfunction as the result of an unstable biasing caused by capacitance coupling in response to the voltage change of node Q21 and floating of the triple p-well of the fourth NMOS transistor N24. The power voltage $V_{cc}$ is applied to node Q22 through the transistors P23 and N23 and is applied to node Q13 through the fourth NMOS transistor N14, therefore causing node Q13 to be maintained at a high state. However, a current path of a memory cell array M21 cannot be set up by a low state of first and second address signals ADDR1 and ADDR2. Eighth and ninth NMOS transistors N28 and N29 are not turned on because the address signals ADDR1 and ADDR2 are maintained at a low state. Therefore, node Q23 is maintained at a high state and the second PMOS transistor P22 is turned off and the second NMOS transistor N22 is turned on by node Q23. As the second NMOS transistor N22 is turned on, the potential at node Q21 changes to a low state, and it turns off the fourth NMOS transistor N24. Therefore node Q23 maintains a constant potential by the above-mentioned procedure in spite of an increase in the power voltage when it is applied.

At time T2, high levels of the first and second address signal ADDR1 and ADDR2 are respectively applied to the eighth and ninth transistors N28 and N29. However, node Q23 continually maintains the same potential since a high enough word line voltage is not applied for turning on a memory cell array M21.

At time T3, a high level of the word line voltage is applied to the memory cell array (non-volatile transistor) M21 so that a current path of the memory cell array is established. In other word, the potential at node Q23 is maintained at a constant level in the case that the memory cell array is programmed and the potential at node Q22, which is a sensing node, has a value equal to the difference between the power voltage $V_{cc}$ and the threshold voltage on the third PMOS transistor P23 and the third NMOS transistor N23. In the case that the memory cell array M21 is erased, a current flows through the cells so that the voltage at node Q22 is lower than the case when the cell is programmed. As a result of the above-mentioned operations, the sense amplifier 21 compares the voltage at node Q22 and the reference voltage Vref and determines an output in response to the comparison.

In the case that a bit line pre-charge is performed and a current does not flow through the cell, the potential at node Q21 is higher than the potential at node Q23 because the threshold voltage at the fourth NMOS transistor N24 has a positive value. Therefore, the current may flow through the cell and a time delay can be ignored in the case that the voltage at node Q21 is increased. Comparing the sensing circuit of the present invention with a conventional sensing circuit, a maximum 10 ns improvement can be expected. After a bit line pre-charge is performed, the potential at node Q21 decreases so the fifth NMOS transistor N25 is turned off and the potential at the fourth node Q24 is maintained at an initial voltage since there is not a discharge path. As a result, the threshold voltage on the fourth NMOS transistor N24 is decreased.

Also, if the sensing enable bar signal SAENb is applied at a high level for disabling the sense amplifier after sensing the cell condition, node Q24 has a ground potential at the result of discharging. This means that the fourth NMOS transistor N24 is not influenced by a breakdown voltage since the fourth NMOS transistor N24 is a high voltage element in the case that the sensing amplifier enable bar signal SAENb is applied at a high level for disabling a sense amplifier, the program enable signal PGMEN is applied at a high level and 5 V is applied for cell programming by turning on the seventh NMOS transistor N27. The fourth NMOS transistor N24 maintains a 0.47 V threshold voltage through a ground potential applied to the p-well; therefore, leakage current can be eliminated. The depletion NMOS transistor has a threshold voltage of 0 V so leakage current cannot flow.

The sensing circuit of the present invention eliminates the threshold voltage on the high voltage transistor; therefore, it prevents gate oxide breakdown, makes it possible to drive the sensing circuit using a low voltage, and improves the processing speed by improving transconductance.

While the present invention has been described with respect to certain preferred embodiments, it will be apparent to those skilled in the art that various changes and modifications may be made without departing from the scope of the invention as defined in the following claims.

What is claimed is:

1. A sensing circuit of a non-volatile memory device, comprising:

a memory cell array;

regulation means for regulating a power voltage at a certain level in response to a control signal;

first switching means for setting up a current path from a power source to said memory cell array in response to an output signal of said regulation means;

second switching means for controlling a well potential on said first switching means in response to said control signal;

third switching means for controlling a well potential on said first switching means in response to said regulation means; and a sense amplifier for sensing a condition of said memory cell array and determining an output signal by comparing a sensing result and a reference voltage.

2. The sensing circuit as recited in claim 1, wherein said first switching means is a transistor having at least one isolated well.

3. The sensing circuit as recited in claim 1, wherein said second switching means is applied between a well of said first switching means and a ground and is an NMOS transistor driven by said control signal.

4. The sensing circuit as recited in claim 1, wherein said third switching means is applied between a well of said first switching means and a power source and is an NMOS transistor driven by an output signal of said regulation means.

* * * * *